United States Patent [19]
Merritt et al.

[11] Patent Number: 6,051,659
[45] Date of Patent: Apr. 18, 2000

[54] HIGHLY SENSITIVE POSITIVE PHOTORESIST COMPOSITION

[75] Inventors: David Paul Merritt, Cold Spring; Wayne Martin Moreau, Wappingers Falls; Robert Lavin Wood, Poughkeepsie, all of N.Y.

[73] Assignee: International Business Machines Corporation, Armonk, N.Y.

[21] Appl. No.: 08/961,186

[22] Filed: Oct. 30, 1997

Related U.S. Application Data

[63] Continuation of application No. 07/933,432, Aug. 20, 1992, abandoned.

[51] Int. Cl.$^7$ ........................................................... C08F 8/00
[52] U.S. Cl. ................... 525/354; 525/328.9; 525/333.3; 525/333.5; 525/355
[58] Field of Search ...................................... 525/354, 355

[56] References Cited

U.S. PATENT DOCUMENTS

| | | | |
|---|---|---|---|
| 4,491,628 | 1/1985 | Ito et al. | 430/176 |
| 4,507,230 | 3/1985 | Tam et al. | 525/54.11 |
| 4,552,833 | 11/1985 | Ito et al. | 430/325 |
| 4,613,398 | 9/1986 | Chiong et al. | 156/628 |
| 4,678,737 | 7/1987 | Schneller | 430/270 |
| 4,810,613 | 3/1989 | Osuch et al. | 430/192 |
| 4,812,542 | 3/1989 | Schwalm et al. | 526/265 |
| 5,350,660 | 9/1994 | Urano et al. | 430/176 |

OTHER PUBLICATIONS

H, Ito, "Solid–State Thermolysis of Poly(p–t–Butoxycarbonyloxystyrene) Catalyzed by Polymeric Phenol: Effect of Phase Separation", Journal of Polymer Science: Part A, vol. 24, p. 2971–2980, (1986).

*Primary Examiner*—Bernard Lipman
*Attorney, Agent, or Firm*—Steven Capella

[57] ABSTRACT

Positive resists sensitive to UV, electron beam, and x-ray radiation which are alkaline developable are formulated from a polymer material comprising recurrent structures having alkaline soluble groups pendent to the polymer backbone, a portion of which groups are substituted with acid labile groups.

11 Claims, 3 Drawing Sheets

HIGHLY SENSITIVE POSITIVE PHOTORESIST COMPOSITION

This application is a Continuation of Application Ser. No. 07/933,432, Aug. 8, 1992, now abandoned.

BACKGROUND OF THE INVENTION

1. Technical Field

The present invention relates to highly sensitive positive photoresist compositions which are mixtures of certain partially substituted polymeric materials and cationic photoinitiators. In particular, there are provided photoresist compositions with greatly improved sensitivity without deterioration of their processability. These compositions which may be conveniently developed with alkaline developers display increased sensitivity to ultraviolet (UV), electron beam (E-beam) and X-ray radiation, are thermally stable at temperatures up to about 165° C., adhere readily to silicon dioxide and silicon nitride layers on a substrate, and may be treated with organometallic reagents (e.g., silylating agents) without the necessity of any post development baking. The films formed may be processed with very little image shrinkage on exposure and development and provide essentially crack-free resist layers. The partially substituted polymeric materials comprise recurrent structures having alkaline soluble groups pendent to the polymeric backbone, a portion of which groups have been substituted with (protected by) acid labile groups.

2. Background of the Invention

The fabrication of semiconductor devices requires the use of resist compositions which maintain imaged patterns during a processing. As the need to increase semiconductor circuit density has dictated a movement from very large scale integration (VLSI) devices to ultra-large scale integration (ULSI) devices, the demands for submicron photolithography with sensitivity to produce and maintain ultra-fine tolerances become more critical.

Chemically amplified resist systems having a polymer and sensitizer combination which generate an initial acid from the sensitizer and additional acid from the polymer provide increased sensitivity to UV, e-beam and x-ray radiation.

In Ito et al., U.S. Pat. No. 4,491,628, resists sensitive to ultraviolet (UV), electron beam and X-ray radiation capable of forming either positive or negative tone patterns dependent upon the choice of developers were disclosed. Such resist compositions are formulated from a polymer having recurrent acid labile groups (such as tertbutyl esters and tertbutyl carbonates) which undergo efficient acidolysis to effect a change in polarity (solubility) and a photo-initiator which generates acid upon radiolysis. The polymer may be a copolymer which includes polymers having recurrent acid labile groups. When being used to form positive images the Ito materials have possibility drawbacks that are directly related to the completeness of removal of the acid labile group on the film composition. These factors relate to skin formation, shrinkage, cracking and poor adhesion which require delicate control to overcome.

In Ito et al., U.S. Pat. No. 4,552,833, there is provided a process for generating negative images wherein a film of a polymer having masked functionalities is coated onto a substrate, the film is imagewise exposed, the exposed film is treated with an organometallic reagent, and the treated film is developed with an oxygen plasma. That disclosure contemplates the dry development of polymers similar to those disclosed in U.S. Pat. No. 4,491,628. The dry development process avoids changes in film compositions that lead to processing complications In Chiong et al., U.S. Pat. No. 4,613,398, still other processes are disclosed entailing the removal of acid labile protecting groups from pendent alkaline soluble groups on a resist polymer such as hydroxyl, amine, carboxyl, phenol, or imide NH which are capable of reacting with the organometallic reagent. Upon silylation and further processing negative images are obtained.

In U.S. Ser. No. 922,657, filed Oct. 24, 1986 now abandoned and assigned to the assignee of the present application, there are described certain highly sensitive resists that achieve high autodecomposition temperatures due to the presence of secondary carbonium ion forming acid labile substituent groups on polymers having pendent carbonate or carbonate-like groups.

Ito, *J. Polymer Science* Part A, 24, 2971–80 (1986) discloses effects of p-hydroxystvrene groups in the thermolysis of poly(p-t-butyloxycarbonyloxy styrene) and devises a method to make such substituted polymer via a copolymerization of butyloxycarbonyloxy styrene with formyloxy styrene followed by photo-fries decomposition to convert the formyloxystyrene units to hydroxystyrene units.

SUMMARY OF THE INVENTION

In accordance with the present invention, highly sensitive positive photoresist compositions are made by combining a polymeric material having functional groups pendent thereto which contribute to the solubility of the polymer in alkaline developers, a portion of which functional groups are substituted with masking or protecting acid labile groups which inhibit the solubility of the polymer, and a photo-initiator compound which generates a strong acid upon radiolysis which is able to cleave or remove the acid labile groups from the polymer to unmask or deprotect functional sites. From 15 to 40 percent of the pendent functional groups are masked or protected with acid labile groups. The preferred protecting groups will also generate acid when they are cleaved or removed and cause additional cleavage or removal of masking as protecting groups, furthering the formation of a latent image. The most preferred protecting group-functional group structure is tert-butyl carbonate of a phenol. On acid generated decomposition, it is believed that the mechanism includes formation of a phenoxycarbonyloxy ion and a tertiary carbonium ion which further decompose to provide phenol, carbon dioxide, isobutene and proton (H+) fragments, the latter being available for further deprotecting of the polymer. Other protecting croups which generate a proton such as the secondary alkyl substituted moieties as disclosed in U.S. Ser. No. 922,657, the disclosure of which is hereby incorporated by reference into this application, may also be used, however, such groups are generally more tightly bound to the groups on the polymeric material functional groups and do not provide as much sensitivity as do the tertbutyl carbonates of phenols.

It has been surprisingly found that a polymer having from 15 to 40 percent substitution with acid labile protecting groups exhibits far more sensitivity than a polymer which is essentially fully protected. This is especially surprising since the fully unprotected polymer provides verb limited resolution and image discrimination to a positive tone.

Polymer backbones having pendent aromatic groups provide the thermal and dimensional stability which are desired in order to provide a material which may be applied to a substrate in a uniformly thin coating, which may be baked to remove solvent and which after imaging and patterning provides chemical resistance in subsequent process steps.

The preferred polymer backbone is polystyrene having substituent functional groups on the aromatic ring to impart aqueous alkaline solubility to the polymer. These groups not only must provide solubility, but they must be maskable with a blocking or protective group that is acid removable in response to the radiolysis of the acid generating sensitizer. The functional groups ideally should be one which does not adversely interact with the semiconductor processing environment. For that reason phenolic groups are most preferred.

The partially substituted polymeric materials are not the result of a copolymerization of monomeric materials, but rather result from side chain substitution of homopolymers.

The homopolymers may be prepared in accordance with the methods set forth in Ito et al. U.S. Pat. No. 4,491,628, the disclosure of which is incorporated herein by reference. Those methods include phase transfer reactions, free radical polymerization and cationic polymerization to provide p-tert-butyloxy-carbonyloxy styrene and p-tert-butyloxycarbonylox-α-methyl styrene.

DETAILED DESCRIPTION

In accordance with the present invention the substituted polymers were prepared as follows:

EXAMPLE 1

Synthesis of poly-(p-Hydroxystyrene-p-tert-butoxycarbonyloxystyrene)

Figure 1:
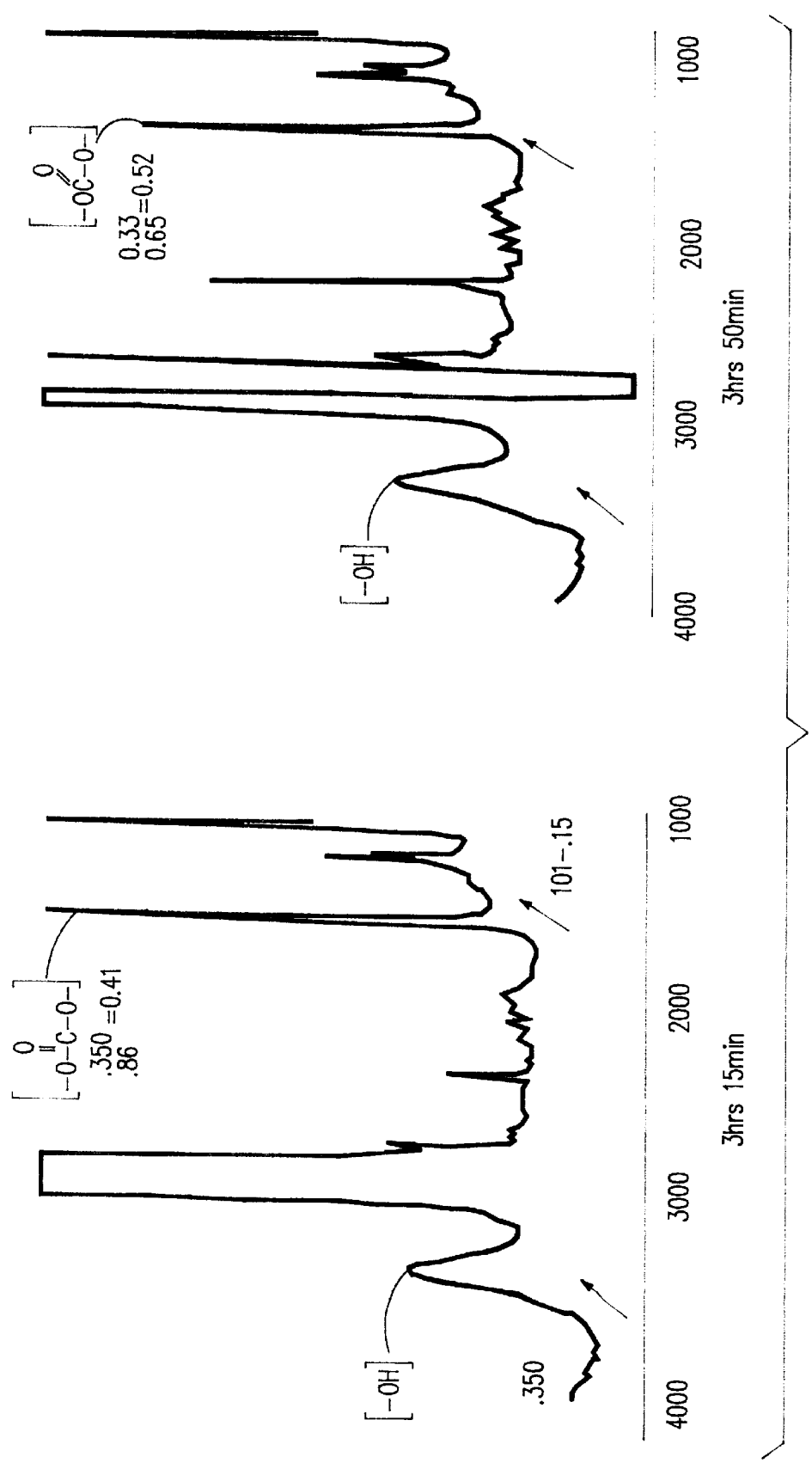
FIG. 1 is a infrared spectrum showing the progress of decarbonation of the polymer.
Figure 2:
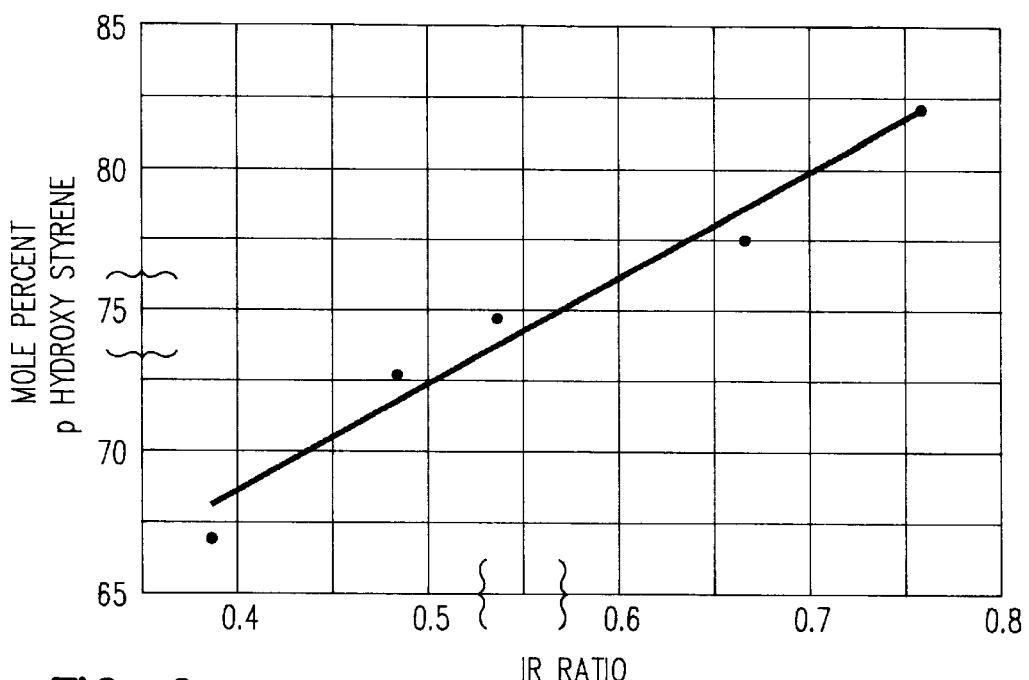
FIG. 2 is a correlation between infrared absorbance and mole percent p-hydroxystyrene in the polymer.
Figure 3:
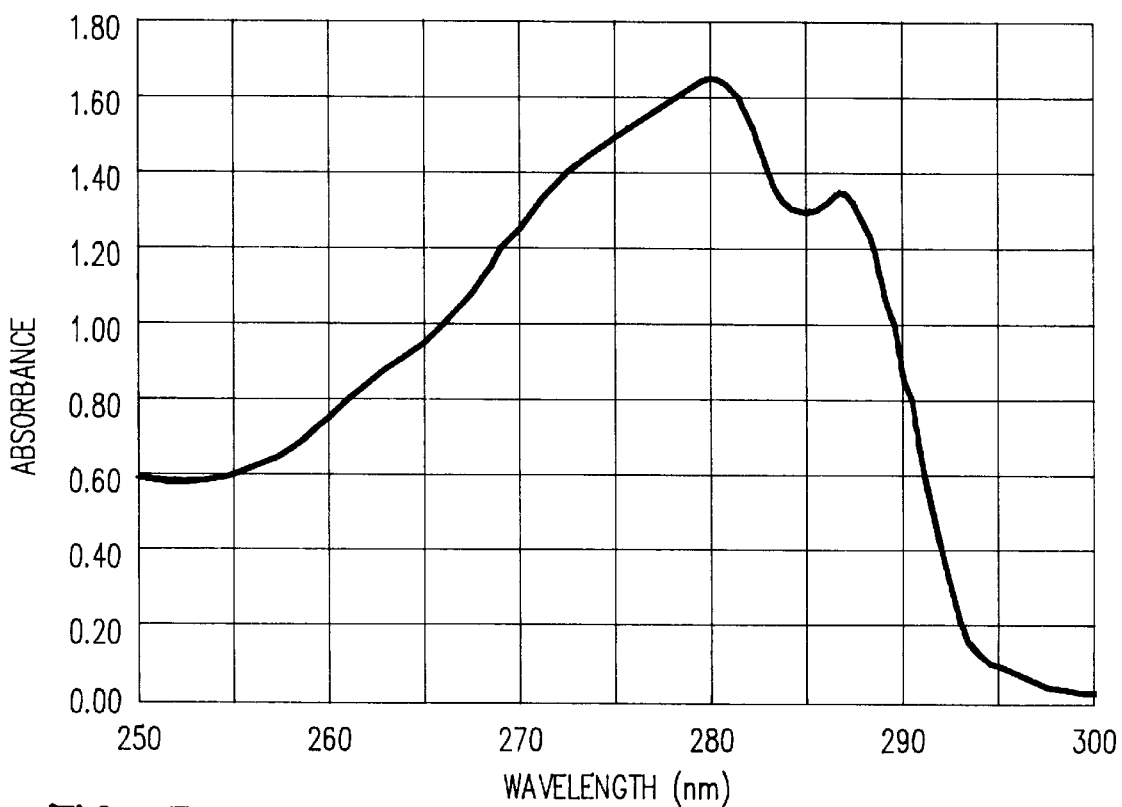
FIG. 3 is a graph of absorbance in a 1 cm path-length cell of a 0.02% diglyme solution made with the polymer of the invention.

300 grams of poly p-tertbutoxycarbonyloxystyrene with a molecular weight of 15,000 was dissolved in 1500 ml of 1,2 dimethoxyethane and the solution was heated to 60.0° C. To the stirred solution was added dropwise 20.0 g of concentrated $H_2SO_4$. The solution is kept at 60° C. for 3–4 hours to convert 75 mole percent of the p-tertbutoxycarbonyloxystyrene groups to p-hydroxystyrene. The reaction was followed by IR of the reaction liquid. The IR peak ratio of the hydroxyl (OH) group peak (3400 $cm^{-1}$) to the carbonate group peak (1750 $cm^{-1}$) was used as the monitor to obtain the desired ratio for conversion to a 75 mole percent p-hydroxystyrene (see FIGS. 1 and 2). The mole percent of p-hydroxsystvrene can also be determined on the final product by UV 286 nm absorbance of a 0.02 weight percent solution in diglyme (corrected for diglyme absorbance). The ratio of the absorbance of the partially substituted to the absorbance of a 0.01% p-hydroxystyrene at 286 nm is used, see FIG. 3. The p-hydroxystyrene is made by the complete conversion (acidolysis) of the initial tertbutoxycarbonyloxystyrene polymer. After the desired tertbutoxycarbonyloxystyrene conversion was determined from the IR monitor, the reaction is quenched by the addition of a solution of potassium carbonate (125 g/250 ml water). The decanted liquid from the reaction is precipitated into a ten-fold ratio of water containing 0.05 M ammonium acetate and the product washed several times with water. The product was dried overnight in vacuum at 50° C. and checked for p-hydroxy styrene content by UV analysis.

EXAMPLE 2

Two substituted polymer compositions were prepared by solution phase acidolysis of the tertbutoxycarbonyloxystyrene polymer having a weight-average molecular weight of about 15000 as described in Example 1.

The first composition contained about 60 mole % tertbutoxycarbonyloxystyrene and 40 mole % p-hydroxy-styrene and the second composition was about 23 mole % tertbutoxycarbonyloxy styrene and 77 mole % p-hydroxy-styrene as determined by UV spectroscopy. These substituted polymers were formulated in propylene glycol methyl ether acetate with 5% (based on weight of solids) triphenylsulfonium hexafluroantimonate salt and were spin coated on silicon wafers to give film thicknesses of about 1.3 microns. Following a 115° C. 15 minute bake, the resists were imagewise exposed on a Perkin Elmer projection aligner in the UV-2 mode (240–300 nm) at doses ranging from 1–100 $mJ/cm^2$. Post exposure conversion was done at 90° C. for 90 seconds on a hot plate. The resists were developed at times ranging from 30 seconds to 5 minutes in an aqueous 0.27 N tetramethyl ammonium hydroxide developer solution at room temperature. Alpha step surface profile measurements of undeveloped films showed that the first film had 18% film shrinkage while the second resist gave only 7% shrinkage. The terthutoxycarbonyloxystyrene homopolymer control gave 33% film shrinkage. Inspection of the developed images showed that the tertbutoxycarbonyloxy styrene polymer control had cracked extensively after only 30 seconds of development. Gross adhesion loss was also noted. The first resist showed a low level of cracking failure after 30 seconds and no adhesion failure. The second resist showed neither cracking nor adhesion failure for up to 5 minutes developing time.

Scanning electron microscope inspection of final images showed that the control was underdeveloped at 60 seconds. Longer developed times could not be evaluated due to poor adhesion and cracking. The first resist gave nearly 1 to 1 mask replication after 30 mJ exposure with 30 second development time. Nearly vertical profiles were obtained, with a slight bread-loaf appearance. The second resist required a higher exposure dose due to the higher optical density in the 240–300 nm range. At 100 mJ for 120 seconds development time, the second resist gave sidewall having 70–80° angles and no trace of bread-loaf. The first and second resists were capable of resolving the smallest masked feature of 0.75 micron.

Figure 4:
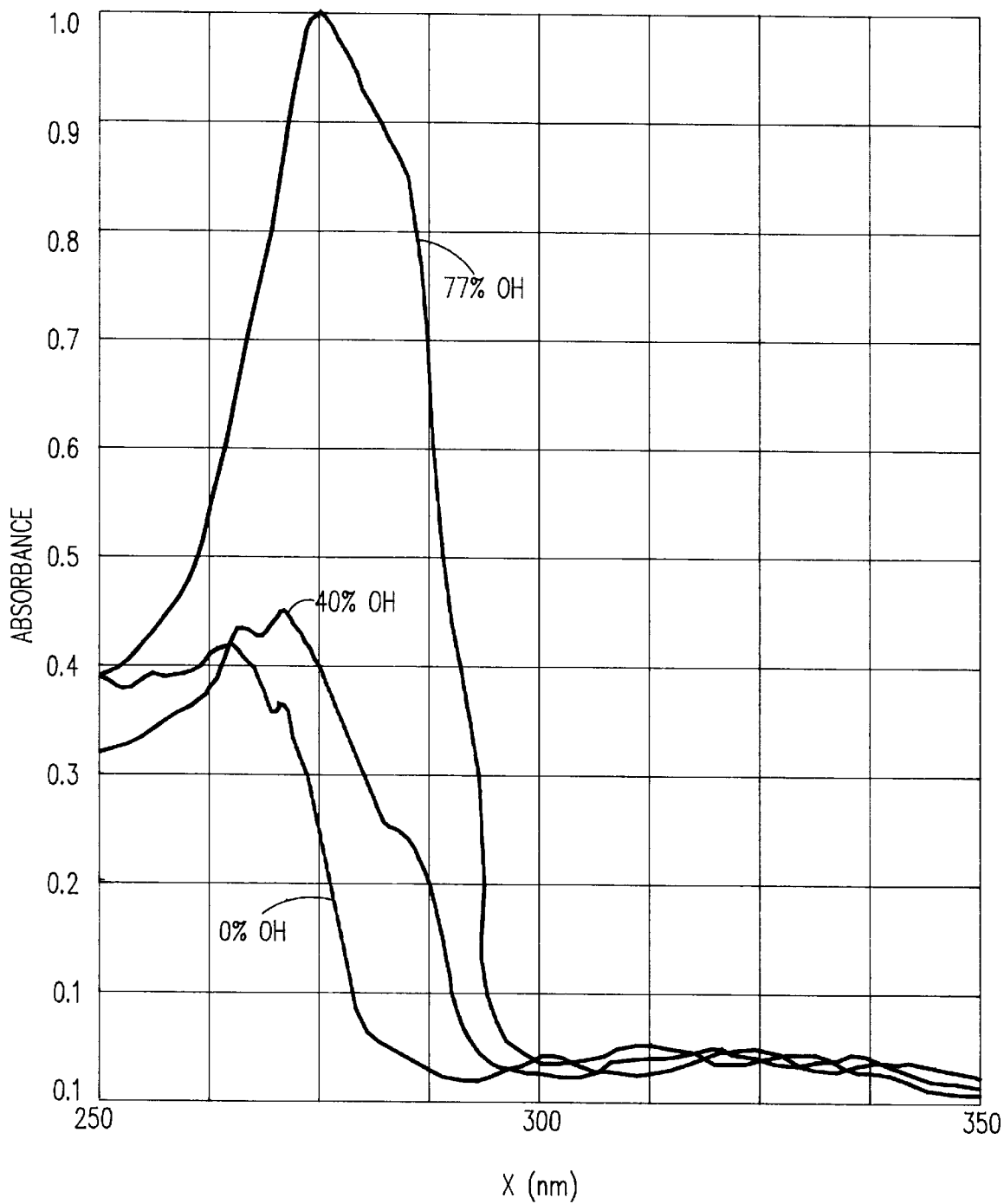
FIG. 4 is a comparative spectral representation of 1.4 μm resist films of various composition.

FIG. 4 shows UV spectra at 1.4 micron films of the first and second resists as well as of a fully protected control resist. These curves show that the incorporation p-hydroxystyrene into the film increases its optical density in the 240–300 nm range. Such incorporation accounts for increased sensitivity and shallower image profiles obtained with the 77% substituted polymers of the second resist.

EXAMPLE 3

One mole of a p-tert-bit,loxycarbonyloxy styrene polymer (BCS) having a molecular weight of 15,000 was dissolved in a 20 weight percent solution of glyme. The solution was then heated under a nitrogen atmosphere to 60° C. To the stirred solution, 0.25 mole of concentrated sulfuric acid was added dropwise and the progress of the reaction was monitored by IR spectroscopy until 78 mole percent of the tert-butyloxycarbonyl (PC) groups were removed and the polymer had 22 percent BC substitution and 78 percent hydroxyl substitution. The reaction was quenched with an excess of ammonium hydroxide and ammonium sulfate was filtered off. The polymer solution was precipitated from a solution of excess ammonium acetate, was washed with water, filtered and dried overnight at 60° C. in a vacuum.

EXAMPLE 4

A p-tert-butyloxycarbonyloxy styrene (BCS) polymer having a molecular weight of 15,000 was heated in nitrogen at 160° C. for two hours. Samples were taken and analyzed for t-butylcarbonyl (BC) content from between 50 mole and 0 mole percent BC remaining. In all cases, the polymer solution in propylene glycol acetate was cloudy and could not be filtered through a 0.2 μm Millipore filter. A sample having 22 mole % tert-butyloxycarbonyloxy styrene and 78 role % p-hydroxy styrene was isolated.

EXAMPLE 5

A poly p-hydroxystyrene polymer having a molecular weight of 11,000 reacted with a solution of ditertiarybutylcarbonate in glyme with triethylamine as a catalyst. The reaction product was precipitated in hydrochloric acid, was stirred with ammonium acetate and was washed with water. IR and UV analysis characterized the polymer as containing 22 mole percent of tert-butyloxy carbonyl groups.

EXAMPLE 6

Preparation of the substituted polymer by copolymerization of p-hydroxystvrene and p-t-butyloxycarbonyloxystyrene monomers was not attempted due to inherent instability of p-hydroxystyrene monomers.

EXAMPLE 7

Polymers having an average mole % composition of 22% tert-butyloxycarbonylo-,y styrene and 78% p-hydroxystyrene derived by the synthetic methods of Examples 3–5 and a control using the BCS starting material of Example 3 were formulated into resists with 7 percent triphenyl sulfonium hexafluoroantimonate sensitizer in a propylene glycol methyl ether acetate. The films were cast onto substrates, were baked at 95° C. for five minutes, were exposed in deep UV radiation at 254 nm, were post exposure baked at 95° C. for ninety seconds, and were developed in an aqueous 0.27 N totramethylammonium hydroxide developer solution.

The sensitivity of each resist was determined by measuring step wedge thickness remaining using a criterion of 95 percent of unexposed film remaining while the exposed area was developed at a given dose. The results are shown in Table I.

TABLE I

| Source of Polymer in Resist | UV Sensitivity, Dose in mJ/cm$^2$ |
| --- | --- |
| Example 3 | 5 |
| Example 4 | 25* |
| Example 5 | 45 |
| Control | 30** |

*Many insoluble particles or residues in image
**Images were cracked and unusable The causes for differences in sensitivity of the resist compositions have polymers having the same ratio of t-butyloxycarbonyloxy groups to hydroxy groups is not understood. The noted differences are reproducible.

Further comparison between the resist made from the Example 3 polymer and a control polymer of p-tert-butyloxycarbonyloxystyrene prepared in accordance with U.S. Pat. No. 4,491,628 yielded the following data:

TABLE II

| | Polymer in Resist | |
| --- | --- | --- |
| Property | Control | Example 3 |
| Sensitivity | | |
| UV photo speed | 30 mJ/cm$^2$ | 5 mJ/cm$^2$ |
| E-beam dose | 10 μc/cm$^2$ | 3 μc/cm$^2$ |
| X-ray dose | 150 mJ/cm$^2$ | 100 mJ/cm$^2$ |
| On set of thermal flow | 90° C. | 165° C. |
| Post silylatable | No* | *Yes |
| Image shrinkage (after DUV hardening) | 37% | 7% |
| Cracking in developer | Yes | No |
| Adhesion to Si, Si$_3$N$_4$ surfaces | Poor | Good |
| RIE erosion | 35% | 10% |
| Base developable | Cracked | Excellent, no cracks |
| UV hardenable | Yes with shrinkage | Yes |

*requires flood UV exposure/baking before silylation

Example 8

Another series of polymers were prepared in accordance with the method of Example 3 and were incorporated into resists in accordance with the method of Example 7. The properties resists containing these polymers and the control were compared.

TABLE III

| | Mole % BC in Polymer | | | | |
| --- | --- | --- | --- | --- | --- |
| | 100 (control) | 64 | 36 | 20 | 16 |
| Shrinkage (percent) | 37 | 18 | 8 | 7 | 7 |
| Crack Development | Severe | Moder. | None | None | None |
| Adhesion | Poor | Fair | Excel. | Excel. | Excel. |
| Resistance to Alkali | Excel. | Excel. | Excel. | Excel. | Poor |
| Image Distortion | Severe | Severe | Slight | Undetectable | Undetectable |

Only the preferred embodiments of the invention have been described above and one skilled in the art will recognize that numerous substitutions, modifications and alterations are permissible without departing from the spirit and the scope of the invention, as set forth in the following claims.

We claim:

1. The method of making a substituted polymeric material for use in resist compositions, comprising the steps of:

(a) dissolving a polymer having acid labile groups pendent to the polymer backbone thereof in an acid stable solvent, (b) heating the solution with stirring under an unreactive atmosphere to a temperature in the range 20 to 70° C., (c) adding concentrated mineral acid to the stirred solution in an amount sufficient to remove acid labile groups from the polymer, (d) continuing the reaction until the desired degree of substitution is achieved, (e) quenching the reaction with base, and (f) precipitating the substituted polymeric material.

2. The method of claim 1 wherein the polymer is polystyrene.

3. The method of claim 1 wherein the acid labile groups are selected from the group consisting of alkyloxycarbonyl, aryloxycarbonyloxy and alkyloxycarbonyloxy.

4. The method of claim 3 wherein the alkyl portion of the acid labile group has an available hydrogen on an a carbon atom.

5. The method of claim 4 wherein the alkyl portion of the acid labile group is secondary alkyl or tertiary alkyl.

6. The method of claim 5 wherein the acid labile group is t-butyloxycarbonyloxy.

7. The method fo claim 1 wherein the pKa of the acid is less than about 4.

8. The method of claim 7 wherein the mineral acid is sulfuric acid.

9. The method of claim 1 wherein the reaction temperature is in the range of 50–60° C.

10. The method of claim 1 wherein the reaction is quenched with ammonium hydroxide.

11. The method of claim 1 wherein the substituted polymeric material is precipitated in ammonium acetate.

* * * * *